United States Patent [19]

Delahoy et al.

[11] Patent Number: 4,692,558

[45] Date of Patent: Sep. 8, 1987

[54] COUNTERACTION OF SEMICONDUCTOR IMPURITY EFFECTS

[75] Inventors: Alan E. Delahoy, Princeton; Vikram L. Dalal, Lawrenceville, both of N.J.; Erter Eser, New York, N.Y.

[73] Assignee: Chronar Corporation, Princeton, N.J.

[21] Appl. No.: 493,700

[22] Filed: May 11, 1983

[51] Int. Cl.$^4$ .................. H01L 31/06; H01L 31/18
[52] U.S. Cl. .................... 136/258; 357/30; 357/88; 357/59; 148/DIG. 18; 437/2; 437/101
[58] Field of Search ............... 148/1.5, 174, DIG. 18; 136/258 PC, 258 AM; 357/2, 30, 63, 88-90, 59 C; 29/572

[56] References Cited

U.S. PATENT DOCUMENTS

| | | |
|---|---|---|
| 4,217,148 | 8/1980 | Carlson ........................... 136/255 |
| 4,366,338 | 12/1982 | Turner et al. ............... 136/258 PC |
| 4,396,793 | 8/1983 | Madan ............................. 136/255 |
| 4,409,424 | 10/1983 | Devaud ........................... 136/258 |
| 4,490,208 | 12/1984 | Tanaka et al. .................... 156/606 |
| 4,531,015 | 7/1985 | Wong et al. ...................... 136/258 |
| 4,547,621 | 10/1985 | Hack et al. .................. 136/249 TJ |
| 4,555,586 | 11/1985 | Guha et al. ...................... 136/259 |
| 4,581,476 | 4/1986 | Yamazaki ......................... 136/258 |
| 4,616,246 | 10/1986 | Delahoy ........................... 357/30 |

FOREIGN PATENT DOCUMENTS

| | | |
|---|---|---|
| 56-150876 | 11/1981 | Japan . |
| 57-43477 | 3/1982 | Japan . |
| 57-187972 | 11/1982 | Japan . |
| 58-132983 | 8/1983 | Japan . |
| 59-54276 | 3/1984 | Japan . |
| 59-54275 | 3/1984 | Japan . |
| 59-52883 | 3/1984 | Japan . |
| 59-54274 | 3/1984 | Japan . |
| 59-115574 | 7/1984 | Japan . |
| 59-229878 | 12/1984 | Japan . |
| 59-213176 | 12/1984 | Japan . |
| 60-50972 | 3/1985 | Japan . |
| 60-41267 | 3/1985 | Japan . |
| 60-240165 | 11/1985 | Japan . |

OTHER PUBLICATIONS

T. D. Moustakas et al, *Appl. Phys. Lett.*, vol. 40, pp. 587–588 (1982).
W. Kruhler et al, Proc. 4th E.C. Photovoltaics Solar Energy Conf. (1982), pp. 754–758.
T. Matsushita et al, *Appl. Phys. Lett.*, vol. 44, pp. 1092–1094 (1984).
R. F. Thompson et al, *Solar Cells*, vol. 10, pp. 189–198 (1983).
H. Haruki et al., *Solar Energy Materials*, vol. 8, pp. 441–455 (1983).
T. D. Moustakas et al, *Appl. Phys. Lett.*, vol. 43, pp. 368–370 (1983).
R. Plättner et al, *Conf. Record, 18th IEEE Photovoltaic Specialists Conf.* (1985), pp. 1598–1603.
M. Konagai et al, *Conf. Record, 16th IEEE Photovoltaic Specialists Conf.*, 1982, pp. 1321–1326.

Primary Examiner—Aaron Weisstuch
Attorney, Agent, or Firm—George E. Kersey

[57] ABSTRACT

Method of counteracting the effects of undesired contaminants in an amorphous semiconductor, and the resulting semiconductor product. An overcompensating agent is incorporated in the semiconductor in a restricted or limited region which is less than the entirety of the semiconductor body. The semiconductor is desirably of amorphous silicon. The undesired contaminant is a p acceptor and the compensating dopant is an n donor. Alternatively, the undesired contaminant can be an n donor and the compensating dopant can be a p acceptor. Typical p acceptors are residual boron and typical n donors are phosphorous. The compensation takes place over the range from about 1 to about 25% of the maximum thickness of the region of compensation. The compensating dopant is present in a limited amount ranging from about 1 part to about 50 parts per million.

17 Claims, 5 Drawing Figures

COUNTERACTION OF SEMICONDUCTOR IMPURITY EFFECTS

BACKGROUND OF THE INVENTION

This invention relates to semiconductors with residual impurity effects, and, more particularly, to methods and devices by which such impurity effects can be counteracted.

In the fabrication of semiconductor devices, undesired impurity effects are frequently encountered. Such is the case, for example, in the fabrication of junction devices. In these devices a semiconductive material having a prescribed characteristic is brought into contact with another semiconductive material having a different kind of characteristic. In general the overall devices may have numerous junctions. To produce the different materials that give rise to the desired junctions, it is common practice to incorporate prescribed dopants into the materials.

Thus, in the case of a PIN solar cell fabricated from amorphous silicon, it is common practice to begin the formation of the device with a P layer which requires the incorporation of acceptor atoms, such as boron, into the silicon layer that is being formed. The latter can be produced in any of a well known variety of ways, including glow discharge, sputtering, and chemical vapor deposition. In such a case residual boron-containing compounds may be left in the manifold through which silicon vapors flow, or may be deposited on the electrodes or walls of the reaction chamber.

The inevitable result is undesired contamination of subsequent layers formed in the chamber.

Although cleaning procedures could be used in seeking to eliminate the contaminant effect, such procedures are not only time consuming and costly, they also usually fail to sufficiently remove the source of contamination.

Accordingly, it is an object of the invention to counteract the effects of undesired contaminants during the fabrication of semiconductor layers and devices.

Another object is to counteract the effects of residual contaminants which may be present in the apparatus used in the fabrication of semiconductor layers and devices.

Still another object is to achieve the counteraction of undesired contaminant effects during the fabrication of semiconductor layers and devices from amorphous silicon, including such diverse procedures as glow discharge and chemical vapor deposition.

A further object of the invention is to counteract impurity effects at the junction of semiconductor devices. A related object is to avoid the degradation in electric field strength at semiconductor junctions caused by undesired impurity effects.

SUMMARY OF THE INVENTION

In accomplishing the foregoing and related objects, the invention provides for counteracting the effects of undesired contaminants in semiconductors by incorporating compensating dopants into the semiconductors. It is particularly desirable for the compensating dopants to be incorporated into the boundary region of the compensated semiconductor. The latter is desirably of amorphous silicon that is fabricated by any well known procedure, including glow discharge and chemical vapor deposition techniques.

The result of the procedure is a semiconductor member in which an undesired contaminant is compensated by a dopant. The member illustratively includes a body of intrinsic material into which the dopant is incorporated. In addition, the compensation may be by a dopant which is incorporated into a layer that is itself otherwise specifically doped.

In accordance with one aspect of the invention, the dopant may be present in an amount which exceeds the requirement for complete compensation. When the undesired contaminant is produced by a p acceptor, the compensating dopant is a n donor. Conversely, when the contaminant is an n donor, the compensating dopant is a p acceptor.

In accordance with another aspect of the invention, the incorporation of a dopant which compensates for residual contamination has the effect of modifying the field at the junction between two different semiconductor materials. In particular, the modified field serves to enhance the performance of the device over a prescribed band of frequencies. In the illustrative case of a PIN device (solar cell), the compensating dopant in the I (intrinsic) layer counteracts the undesired residual effect of p donors resulting from the prior fabrication of the P layer and increases the quantum efficiency of the device for comparatively short wave lengths, i.e., those in the blue and ultraviolet portions of the electromagnetic spectrum.

DESCRIPTION OF THE DRAWINGS

Other aspects of the invention will become apparent after considering several illustrative embodiments taken in conjunction with the drawings, in which:

FIG. 5 is a graph of quantum efficiency plotted against wave length for a compensated PIN solar cell fabricated in accordance with the invention.

DETAILED DESCRIPTION

In the typical manufacturing process for producing a PIN solar cell, successive P, I, and N layers are deposited on one another. In the production of the initial P layer, a p acceptor impurity is introduced in order to provide the desired p+ characteristic for the P layer. The p+ symbology is used to indicate that the P layer is formed by a significant amount of controlled doping. This is to be distinguished from the p symbol standing along which indicates a layer that is incidentally doped.

Figure 1A:
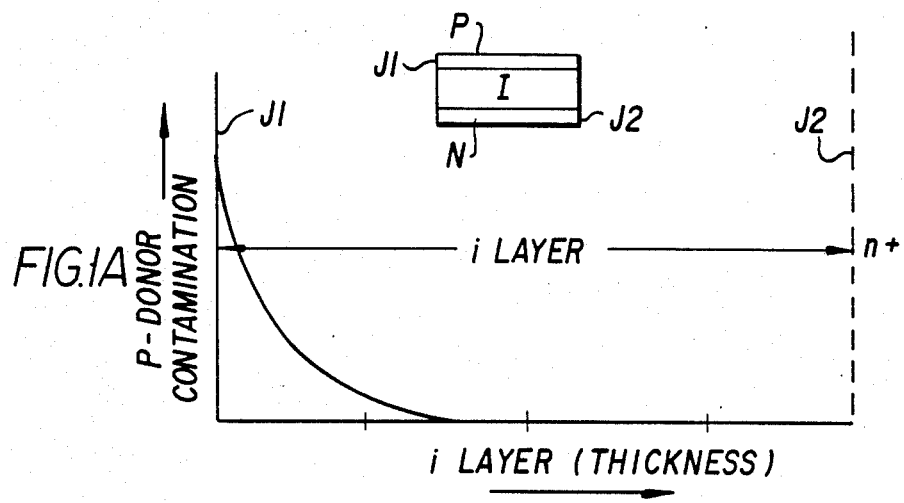
FIG. 1 is a plot of contaminant concentration against layer thickness for an illustrative semiconductor layer of the kind produced by conventional manufacturing practice.
Figure 1B:
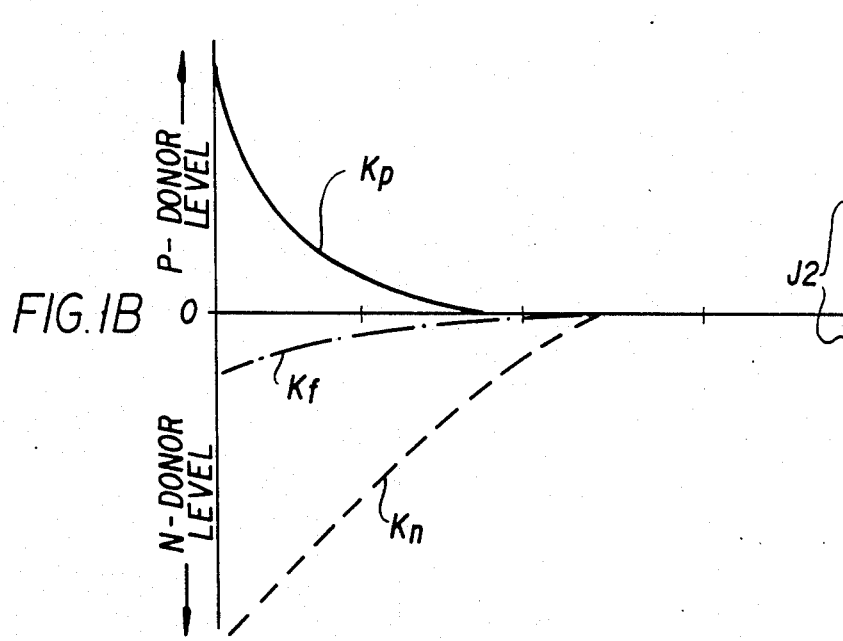

Because a significant amount of dopant is necessary to achieve the desired electrical conductivity for the P layer, there is an inevitable residuum of dopant in or associated with the chamber where the P layer is formed. In, for example, the glow discharge and chemical vapor processes, silicon hydride gases are accomplished by a dopant gas, such as diborane to produce the desired p+ amorphous silicon layer. The diborane leaves a boron residue on the walls of the chamber, in the manifold leading to the chamber, and on the electrodes and substrates associated with the desired silicon deposits. After the P layer is formed, the next step is to produce a contacting intrinsic layer in order to provide the first required junction. Although the dopant gas flow is terminated while the intrinsic layer is being formed, the residual boron inevitably becomes incorporated into the ensuing desirably intrinsic layer. An illustrative contamination of the intrinsic layer is illustrated in FIG. 1. Beginning at the interface J1, at the surface of the P layer, there is a comparatively high degree of p donor contamination which exponentially decreases, quickly approaching a zero (or finite, but very small) asymptote before about 25% of the ensuing intrinsic layer thickness is formed. By the time the intrinsic layer is completed, and the reaction chamber is ready for the second junction J2 with a highly doped N layer, the initial contamination is reduced almost to zero in the typical cases. Where the I layer is comparatively thin, the initial contamination can have an adverse effect on the ensuing N layer as well.

Figure 2:
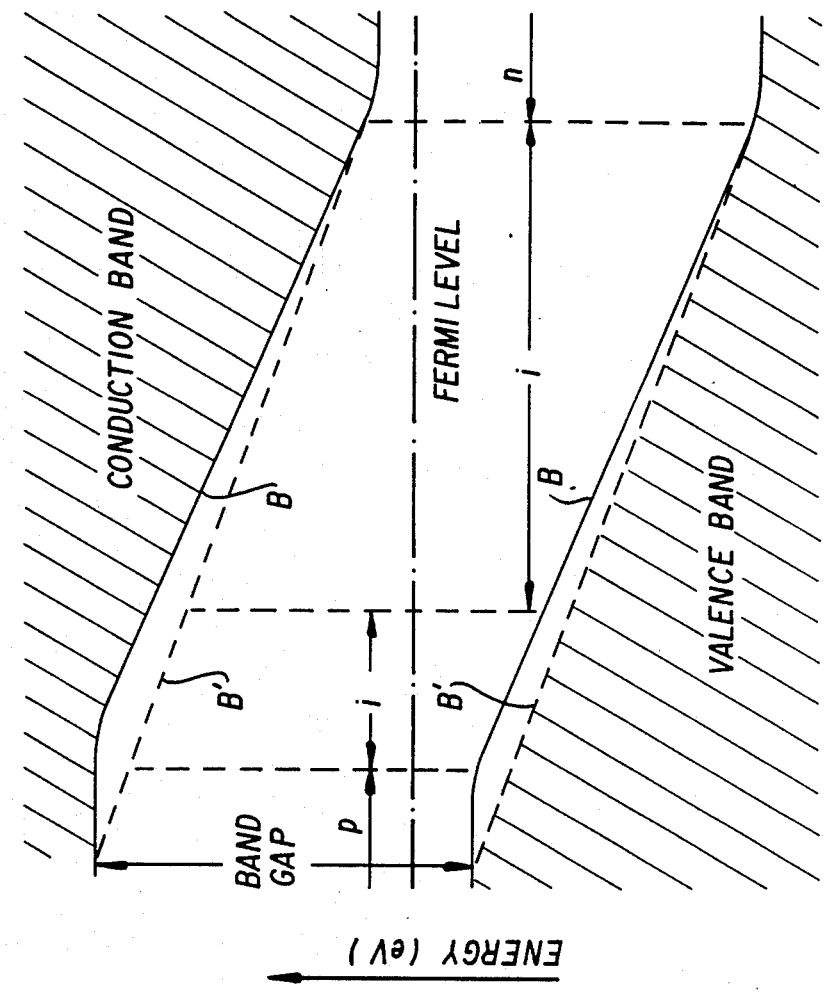
FIG. 2 is a plot of illustrative energy bands over a junction semiconductor device illustrating the effect of impurities on junction field strength.

In any event, the effect of the contamination for the situation depicted in FIG. 1 is illustrated in FIG. 2 which compares the energy band profile (B') that exists in the absence of contamination with that (B) which is associated with the contamination. The electric field existing at any point is equal to the gradient (slope) of the band profile at that point. It can be seen from FIG. 2 that the dashed profile B' has a higher slope in the i-layer region adjacent to the p-i interface than that possessed by the band profile B which exists in the presence of contamination.

The concomitant reduction in the electric field near the junction J1 results in an increased, and undesired, amount of electron diffusion counter to the electric field, i.e., towards the p-layer. This electron current flow subtracts from the desired hole current flow toward the p-layer. In the case of a solar cell, the current produced by the cell will be diminished, especially at short wavelengths where photogenerated electron-hole pairs are created in close proximity to the junction J1.

For the particular situation depicted by FIG. 1 and the solid line band profile of FIG. 2, the contaminant effect is counteracted by the introduction of an opposite character dopant. In the case of FIGS. 1 and 2 where the illustrative contaminant is a p acceptor, the compensation is achieved using an n donor.

Figure 3:
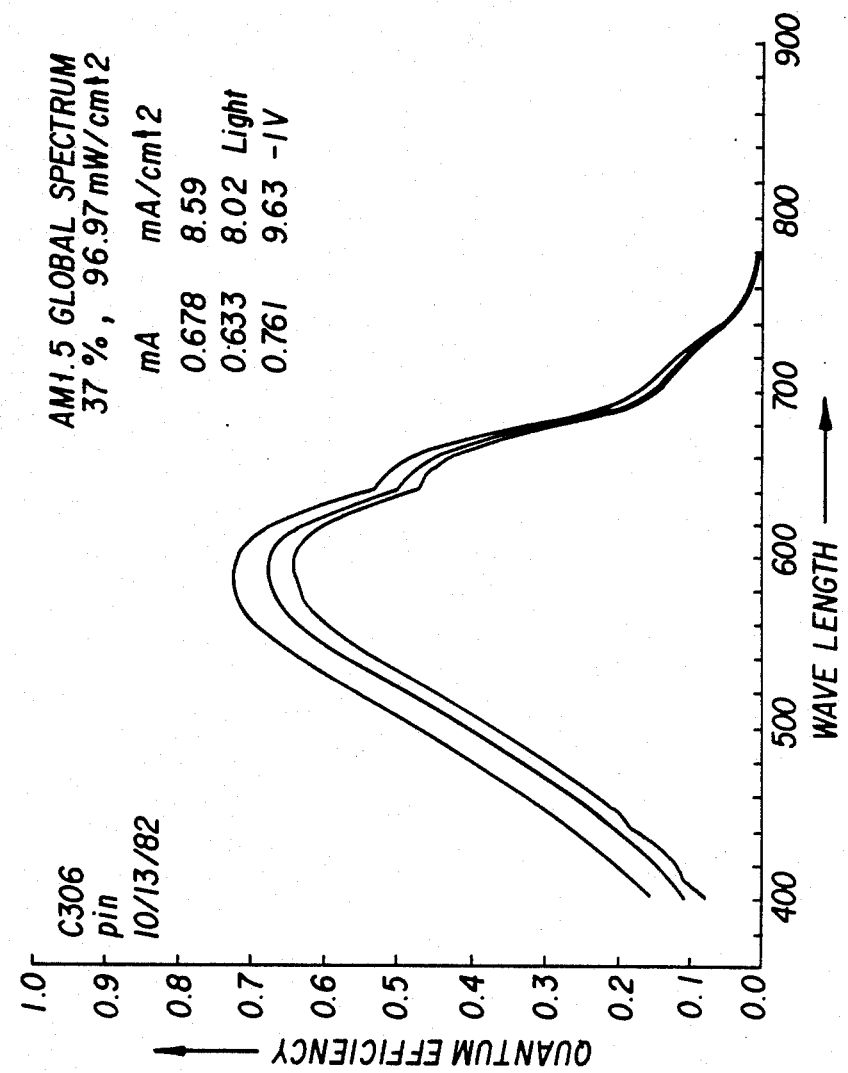
FIG. 3 is a plot illustrating the compensation of the contaminant effect shown in FIG. 1 by the use of a compensating dopant.

As shown in FIG. 3, the opposite charges of the contaminants and compensators tend to neutralize one another. In the specific case of FIG. 3, the curve $K_n$ for the n donor has greater ordinates than the corresponding curve $K_p$ for the undesired p acceptor contaminants. This produces a slight overcompensation, represented by the curve $K_f$ and further increases the electric field at the interface junction J1, but decreases the field in the bulk. It will be appreciated excessive overcompensation must be avoided in order to avoid interference with the performance of the resulting device. This is because the bulk of the I layer must be substantially donor free in order to avoid doping-induced defects and to maintain good transport properties.

Experimental results have been indicated that the over-compensation may be made to the extent of about 1 to about 50 parts per million and that the region of both the compensation and, where desired, overcompensation is desirably limited to about the first 25% of the thickness of the layer being compensated. Experimental results have indicated that compensation extending beyond about 25% tends to produce an increase in defect densities which reduce the efficiency of the resulting device.

Figure 4:
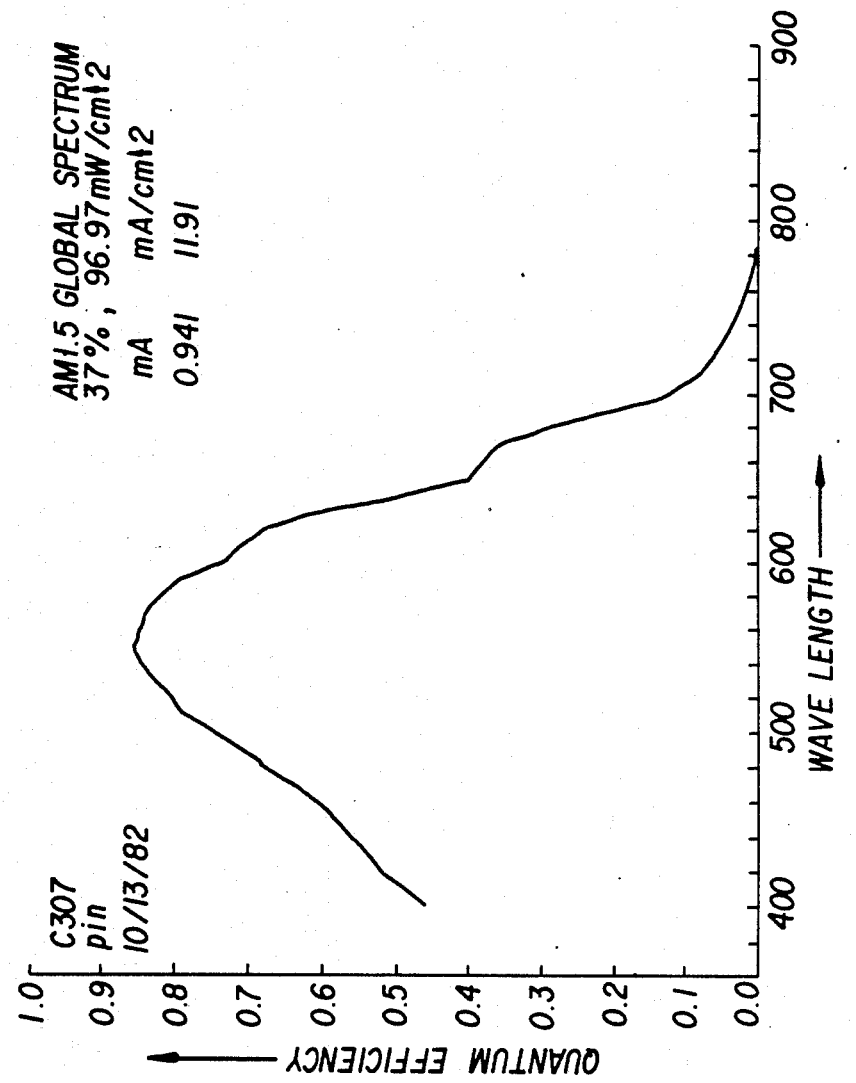
FIG. 4 is a graph of quantum efficiency against wave length for PIN solar cells fabricated by successive layer deposition using prior manufacturing techniques.

FIG. 4 shows a plot of quantum efficiency (QE) against wavelength, measured in nanometers (nm), for a non-compensated PIN solar cell manufactured in a conventional way and tested under three different biasing conditions: (1) zero bias, (2) light bias, and (3) minus one volt. It is apparent that the quantum efficiency in the range below 550 nanometers is undesirably poor.

However, by fabricating the device in accordance with the invention, the results shown in FIG. 5 for zero bias were achieved in which the quantum efficiency (QE) at 400 nanometers is approximately 0.5, as compared with values below 0.2 for FIG. 4.

In the devices of FIG 4, the P layer was produced by depositions for 40 seconds using a silane gas mixture containing diborane as a gas dopant.

In the case of FIG. 5 compensation was achieved using 9 parts per million of n donor in the form of phosphine gas for 10 minutes out of the approximate 80 minute duration during which the I layer was formed.

It will be appreciated that the foregoing compensation technique may be applied to a wide range of semiconductor materials including germanium as well as silicon, and that the compensation technique is not limited to any particular method of fabrication.

In addition the dopant can be incorporated by diffusion after the layer to be doped has been formed, as contrasted with the inclusion of a dopant gas during layer formation.

It will also be appreciated that the invention can be used to form a wide variety of semiconductor devices, ranging from two element devices such as diodes to multielement devices in which the multiple elements are associated with stacked subordinate entities, or with single entities having more than two layers.

The invention is further illustrated by the following non-limiting examples.

EXAMPLE I

A PIN solar cell of the kind depicted in FIG. 1 was formed by making an initial deposit of p-type hydrogenated amorphous silicon carbide onto a $SnO_2$ coated glass substrate. For that purpose a gaseous mixture containing monosilane and diborane was introduced into a radio frequency glow discharge operated at 170 volts peak-to-peak, the pressure being 500 milliTorr (0.5 millimeters of mercury), and the substrate temperature 280° C. The deposition time was 40 seconds. The flow of diborane was terminated and a new gas mixture was introduced, consisting of silane, argon, and a counteractant in the form of 0.0009% phosphine. The actual flow rates for the silane, argon and 10 parts per million phosphine in argon were 7.4 SCCm (standard cubic centimeters per minute), 55 SCCm, and 6.7 SCCm respectively. A radio frequency glow discharge was run for 10 minutes at 330 milliTorrs of pressure, again with a radio frequency voltage of 170 volts peak-to-peak.

The I layer was completed by a radio frequency glow discharge of a silane-hydrogen mixture for 70 minutes at 470 milliTorr, 170 volts peak-to-peak, with a substrate temperature of 250° C. The basic cell structure was completed by an AC glow discharge of a silane-argon-phosphine gas mixture ($PH_3/SiH_4=4\%$) for 5 minutes at 500 mTorr, 280° C., to produce an N layer. Evaporation of an aluminum contact onto the N layer completed the device.

The resulting layers had a thickness of about 100 Angstrom units for the P layer, 6,000 Angstrom units for the I layer, and 500 Angstroms for the N layer. In addition, the gases used to form the P layer were accompanied by hydrogen as a diluent to improve the reproducibility of the P layer, and by methane to add carbon to the P layer and reduce optical absorption.

The n donor for the N layer was phosphorus. The resulting device provided improved solar cell response as compared with cells in which no counteraction of semiconductor impurity effect is made.

While the above example is meant to illustrate how a controlled amount of compensating dopant can be used to improve an amorphous silicon solar cell, it will be appreciated that other conditions of preparation of amorphous silicon cells, such as DC glow discharge, pyrolytic deposition from higher silanes, and ion beam sputtering can also be used to grow improved amorphous silicon cells, so long as a controlled, compensating dopant is introduced into the intrinsic or base layer of amorphous silicon junctions.

It is to be emphasized that the compensating dopant is introduced into a limited spatial region of the intrinsic layer, adjacent to the junction layer previously made.

It will be further appreciated that if the solar cell were of p+nn+ type, where instead of an intrinsic i layer, a lightly doped n layer were used as a base layer, sandwiched between the heavily doped p+ and n+ layers, the compensating dopant would be introduced at the interface between the p+ and n layers (on the assumption that the p+ layer was grown first), and would be an n-type dopant, slightly higher in doping concentration than the base region n-type doping.

The principle of compensating dopants applies equally well to an n+pp+ cell, where the n+ layer is deposited first, followed by a lightly doped p layer and finally the p+ layer. In this case the dopant would be a p-type material, slightly higher in concentration than the doping of the base region layer.

Those skilled in the art will also appreciate that the principle of compensating dopants over a limited spatial extent applies equally well to multiple-junction cascade cells, and to pin cells where the thickness of the i regions varies from a few hundred Angstrom to a few thousand Angstrom. The spatial extent of the compensating region is limited from about 1% to about 25%, including the region from about 5% to about 25%, of the thickness of the i layer of each cell in a multiple-junction, cascade cell arrangement.

It will also be appreciated that other amorphous semiconductor cells, such as those made from higher silanes or from combinations of Group IV elements (e.g. of an alloy of silicon and germanium) may also be usefully employed in accordance with the present invention.

In addition, the other operating conditions can be varied widely. For example the deposition voltage can be in the range from about 100 to 1000 volts. The radio frequency can vary between about 10 and 50 megahertz, and the pressure can vary between about 0.1 Torr and 2.0 Torr. Moreover the diluent and carbon contributor (methane) can be omitted. The amount of compensating dopant can range from about 1 part to about 50 parts per million.

Besides phosphine, suitable gases for introducing n dopant include arsine and the like. For p acceptors suitable gases besides diborane include boron trichloride and boron trifluoride.

While various aspects of the invention have been set forth by the drawings and specification, it is to be understood that the foregoing detailed description is for illustration only and that various changes in parts, as well as the substitution of equivalent constituents for those shown and described may be made without departing from the spirit and scope of the invention as set forth in the appended claims.

What is claimed is:

1. The method of counteracting the effects of undesired contaminants present in a limited region of one layer of a multi-layered amorphous semiconductor device, which consists essentially of incorporating a compensating agent in said limited region of said device in an amount sufficient to slightly over-compensate for said contaminant.

2. The method of claim 1 wherein said semiconductor device comprises amorphous silicon.

3. The method of claim 2 wherein said amorphous silicon is fabricated by glow discharge, sputtering, or chemical vapor deposition, or any combination thereof.

4. The method in accordance with claim 1 including the step of modifying the field at the junction between two different amorphous semiconductor materials, which comprises
incorporating into one of said materials an amount of a dopant which slightly overcompensates for any residual contamination produced in a limited region of the one material by the other, said compensating dopant being introduced over said limited region into said material.

5. The method of claim 4 wherein said residual contamination is caused by p acceptors and said compensation is achieved by n donors.

6. The method of claim 5 wherein said p acceptor is residual boron and said n donor is phosphorus.

7. The method of claim 4 wherein said field is modified so as to improve the collection of current for comparatively short wave lengths of radiation impinging upon said semiconductor material.

8. The method of claim 1 wherein the amount of compensating is a function of the position within the limited region of addition which is in turn less than the entire thickness of said layer of said semiconductor device.

9. An amorphous semiconductor device of multilayer structure wherein an undersired contaminant present in a limited region of one layer thereof is slightly over-compensated by a dopant incorporated in said limited region.

10. The semiconductor device of claim 9 wherein said limited region is part of a layer of intrinsic material and said device is a solar cell.

11. The semiconductor device of claim 9 wherein the undesired contaminant is a p acceptor and the compensating dopant is an n donor.

12. The semiconductor device of claim 9 wherein the undesired contaminant is an n donor and the compensating dopant is a p acceptor.

13. The method of improving the performance of an amorphous semiconductor AB type solar cell which comprises
incorporating an amount of dopant in a limited portion of the B region of said cell beginning at the interface of said B region with the A region of said cell and extending into said B region over a limited distance; said amount being sufficient to slightly overcompensate for contaminating dopant of opposite conductivity type present in said limited portion of said B region.

14. The method of claim 13 wherein said B region is intrinsic.

15. The method of claim 13 wherein the profile of said compensating dopant is proportioned to have a higher value at the AB interface than elsewhere.

16. The method of claim 15 wherein said limited region is compensated over a range from about 5 percent to about 25 percent of the entire thickness of said B region.

17. The method of claim 13 wherein said compensating dopant is present in a limited amount ranging from about 1 part to about 50 parts per million.

* * * * *